United States Patent
Kurihara

(10) Patent No.: US 11,693,323 B2
(45) Date of Patent: Jul. 4, 2023

(54) CONTROL APPARATUS, POSITIONING APPARATUS, LITHOGRAPHY APPARATUS, AND ARTICLE MANUFACTURING METHOD

(71) Applicant: CANON KABUSHIKI KAISHA, Tokyo (JP)

(72) Inventor: Takashi Kurihara, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/669,725

(22) Filed: Feb. 11, 2022

(65) Prior Publication Data

US 2022/0269185 A1 Aug. 25, 2022

(30) Foreign Application Priority Data

Feb. 24, 2021 (JP) ................................. 2021-027746

(51) Int. Cl.
*G03F 7/20* (2006.01)
*G03F 7/00* (2006.01)

(52) U.S. Cl.
CPC ............... *G03F 7/70775* (2013.01)

(58) Field of Classification Search
CPC ............. G03F 7/70775; G03F 7/70725; G03F 7/0002; Y02P 90/02; G05B 13/0265
See application file for complete search history.

(56) References Cited

U.S. PATENT DOCUMENTS

| 5,757,149 A * | 5/1998 | Sato ................... G05B 19/231 318/135 |
| 10,401,743 B2 * | 9/2019 | De Best ................ G05B 11/14 |
| 10,852,642 B2 * | 12/2020 | Butscher ............ G03F 7/70516 |
| 2020/0233316 A1 | 7/2020 | Asano |
| 2021/0191281 A1 * | 6/2021 | Kurihara ................. G03F 9/70 |

FOREIGN PATENT DOCUMENTS

JP 2019071405 A 5/2019

* cited by examiner

*Primary Examiner* — Hung V Nguyen
*Assistant Examiner* — Hung Henry Nguyen
(74) *Attorney, Agent, or Firm* — Rossi, Kimms & McDowell LLP

(57) ABSTRACT

A control apparatus for controlling a controlled object includes a measuring device configured to measure a state of the controlled object, and a controller configured to generate a manipulated variable corresponding to an output of the measuring device and a target value. The controller includes a compensator configured to output an index corresponding to the output of the measuring device and the target value, and a converter configured to convert the index into the manipulated variable such that a probability at which a predetermined manipulated variable is generated is a target probability.

20 Claims, 10 Drawing Sheets

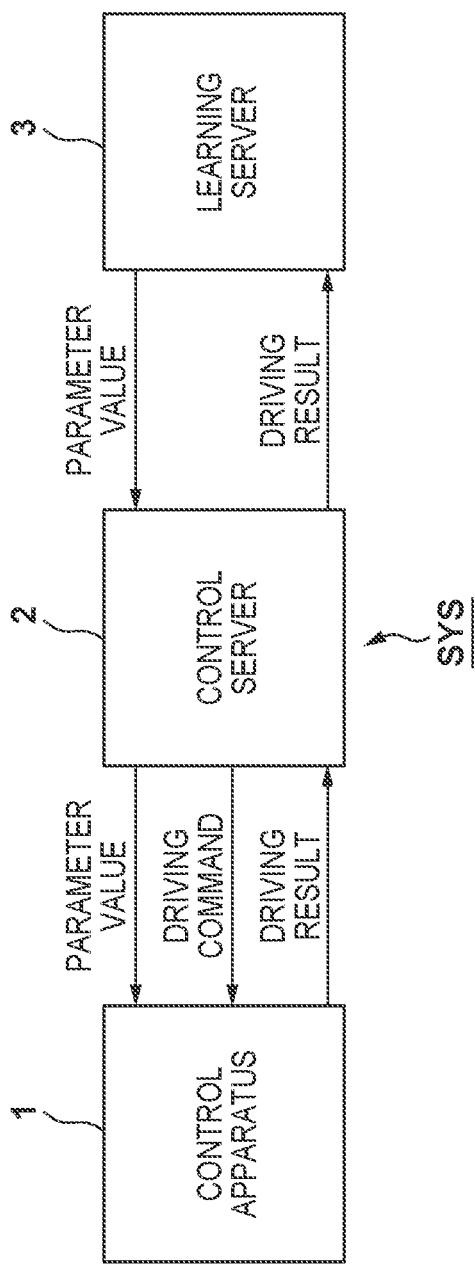
F I G. 1
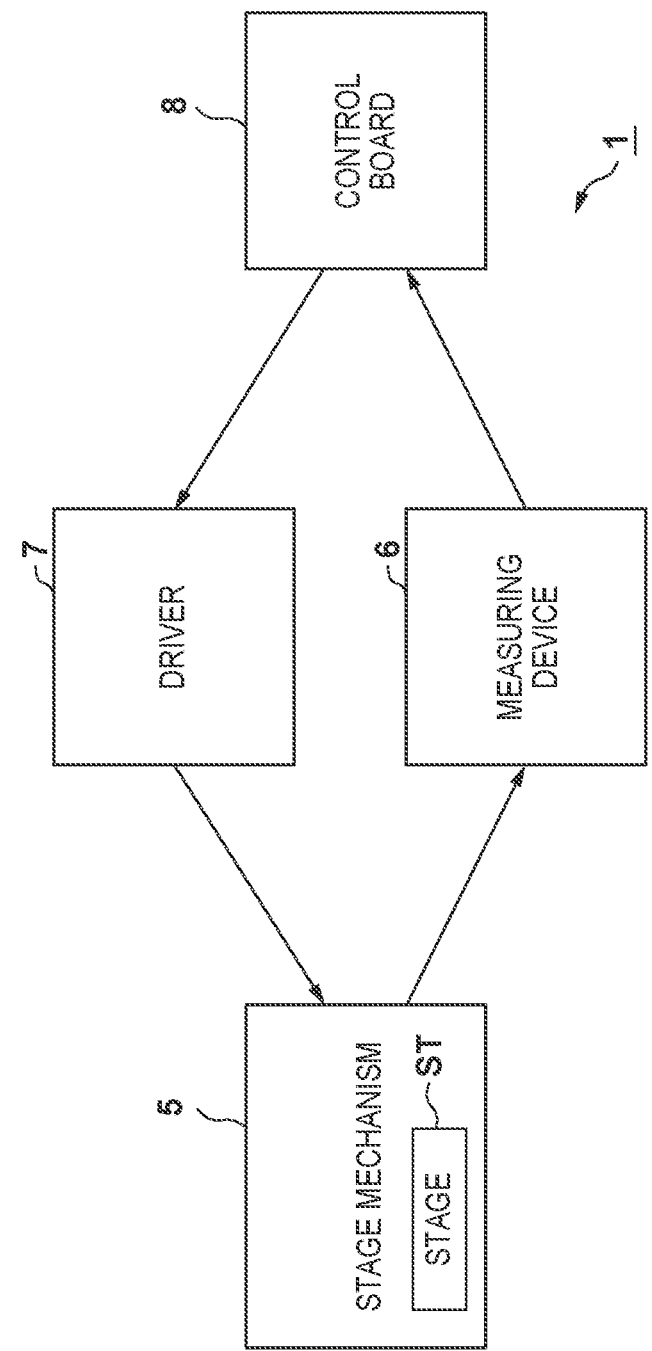
F I G. 2

CONTROL APPARATUS, POSITIONING APPARATUS, LITHOGRAPHY APPARATUS, AND ARTICLE MANUFACTURING METHOD

BACKGROUND OF THE INVENTION

Field of the Invention

The present invention relates to a control apparatus, a positioning apparatus, a lithography apparatus, and an article manufacturing method.

Description of the Related Art

Japanese Patent Laid-Open No. 2019-71405 describes a control system for controlling a stage by using a neural network. This control system includes a first control unit that outputs a first manipulated variable based on control deviation information and a second control unit that outputs a second manipulated variable by the neural network based on the control deviation information, and an adder for adding the first and second manipulated variables. The second control unit includes a restricting unit for restricting the upper and lower limits of the second manipulated variable.

Unfortunately, when the upper and lower limits of the manipulated variable are simply restricted as described in Japanese Patent Laid-Open No. 2019-71405, the neural network generates unnecessary manipulated variables, and this may prevent an improvement of the control characteristics.

SUMMARY OF THE INVENTION

The present invention provides a technique advantageous in improving the control characteristics.

One of aspects of the present invention provides a control apparatus for controlling a controlled object, comprising: a measuring device configured to measure a state of the controlled object; and a controller configured to generate a manipulated variable corresponding to an output of the measuring device and a target value, wherein the controller includes a compensator configured to output an index corresponding to the output of the measuring device and the target value, and a converter configured to convert the index into the manipulated variable such that a probability at which a predetermined manipulated variable is generated is a target probability.

Further features of the present invention will become apparent from the following description of exemplary embodiments with reference to the attached drawings.

BRIEF DESCRIPTION OF THE DRAWINGS

FIG. 1 is a view showing the configuration of a system of the first embodiment;

FIG. 2 is a view showing an example in which a control apparatus in the system of the first embodiment is applied to a positioning apparatus;

DESCRIPTION OF THE EMBODIMENTS

Figure 3:
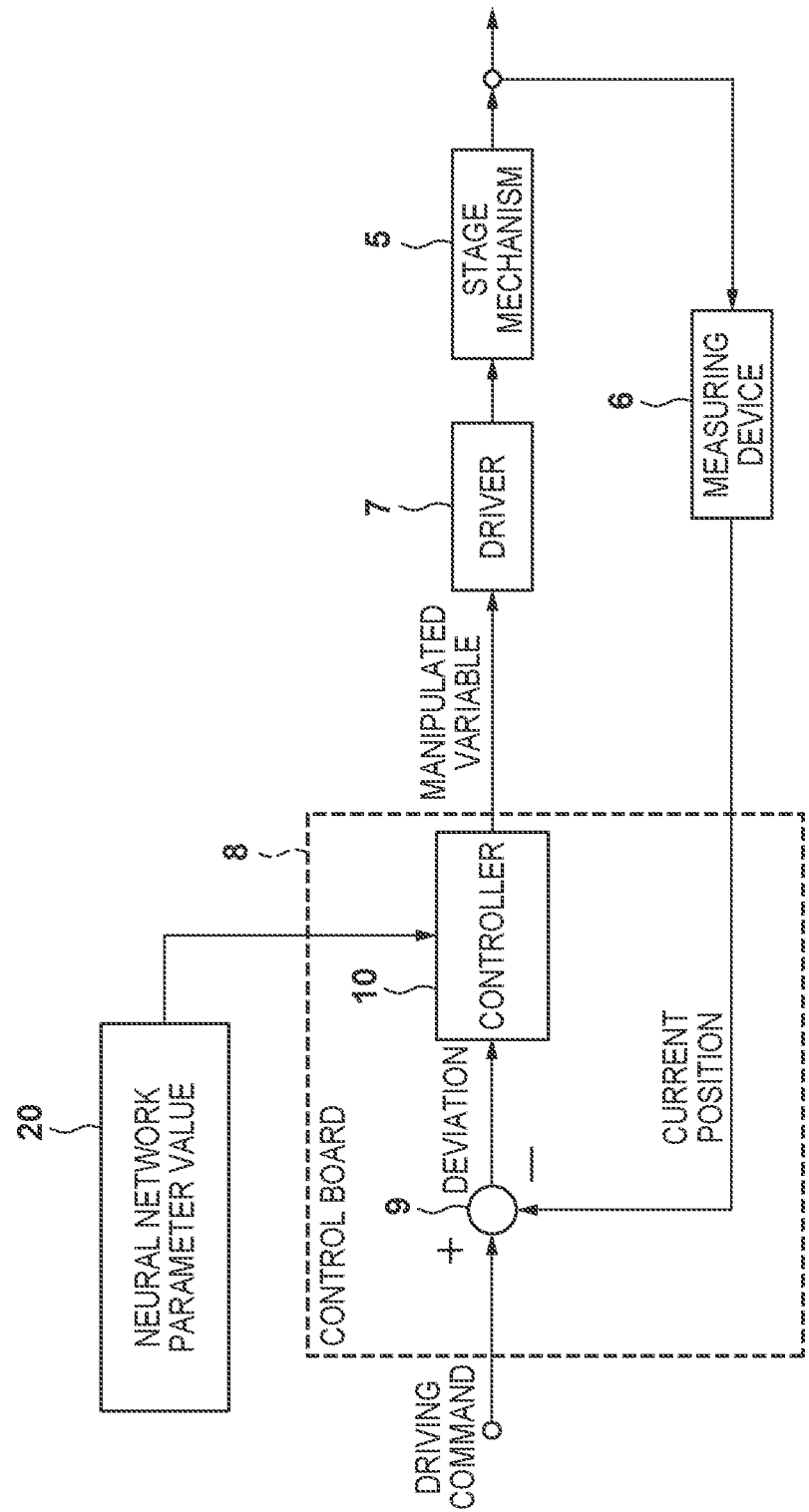
FIG. 3 is a view showing a more detailed configuration of the control apparatus (the positioning apparatus) shown in FIG. 2.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 shows the configuration of a system SYS of an embodiment. The system SYS can include, for example, a control apparatus 1 including a controlled object, a control server 2 for controlling the control apparatus 1, and a learning server 3 for executing learning of the control apparatus 1 via the control server 2. The control apparatus 1 includes a compensator including a neural network. The learning server 3 can send a parameter value of the neural network to the control apparatus 1 via the control server 2, and send a driving command to the control apparatus 1 via the control server 2. The control apparatus 1 can execute an operation of driving the controlled object in accordance with the driving command, and send the driving result (for example, a control deviation) to the learning server 3 via the control server 2. The learning server 3 can calculate a reward based on the driving result, and update the parameter value of the neural network based on the reward.

The functions of the control server 2 can wholly or partly be incorporated into the control apparatus 1. Alternatively, the functions of the control server 2 can wholly or partly be incorporated into the learning server 3. Alternatively, the functions of the control server 2 and the learning server 3 can partly be incorporated into the control apparatus 1. Alternatively, the control apparatus 1, the control server 2, and the learning server 3 can be integrated. The control server 2 can be a host apparatus of the control apparatus 1. For example, the control apparatus 1 can be one constituent element of a lithography apparatus, and the control server 2 can be a main control apparatus of the lithography apparatus, or a comprehensive control apparatus for controlling a plurality of lithography apparatuses including the lithography apparatus.

FIG. 2 shows an example in which the control apparatus 1 in the system SYS shown in FIG. 1 is applied to a positioning apparatus. The control apparatus 1 configured as a positioning apparatus can be so configured as to control a stage ST as a controlled object. The control apparatus 1 shown in FIG. 2 can include a stage mechanism 5, a measuring device 6, a driver 7, and a control board (control unit) 8. The stage mechanism 5 can include the stage ST, and an actuator (not shown) for driving the stage ST. The stage ST can hold a positioning target such as a substrate. The actuator can include at least one of a linear motor, an electromagnetic actuator, a voice coil motor, and a rack-and-pinion mechanism. The controlled object can be the stage ST, or a member (for example, a substrate) held on the stage ST. More macroscopically, the controlled object can be understood as the stage mechanism 5. The measuring device 6 can measure the state (for example, the position) of the controlled object. The control board 8 can send a command (manipulated variable) to the driver 7, and output an electric current to the actuator of the stage mechanism 5. The state (driving result) of the stage mechanism 5 or the stage ST can be measured or detected by the measuring device 6, and provided to the control board 8.

FIG. 3 shows a more detailed configuration example of the control apparatus 1 shown in FIG. 2. The control board 8 can include a calculator 9 for calculating a difference (control deviation) between the state (for example, the position) of a controlled object measured by the measuring device 6 and a driving command (target value) for controlling the controlled object, and a controller 10 for generating a manipulated variable corresponding to the output from the calculator 9. The controller 10 can also be understood as a constituent element for generating a manipulated variable based on the state of the controlled object and the driving command. The controller 10 can operate as a compensator defined by the parameter value of a neural network provided by the learning server 3. The driver 7 can convert the manipulated variable provided by the control board 8 or the controller 10 into an electric current. In other words, the driver 7 outputs, to (the actuator of) the stage mechanism 5, an electric current having a magnitude corresponding to the manipulated variable provided by the control board 8 or the controller 10.

Figure 4:
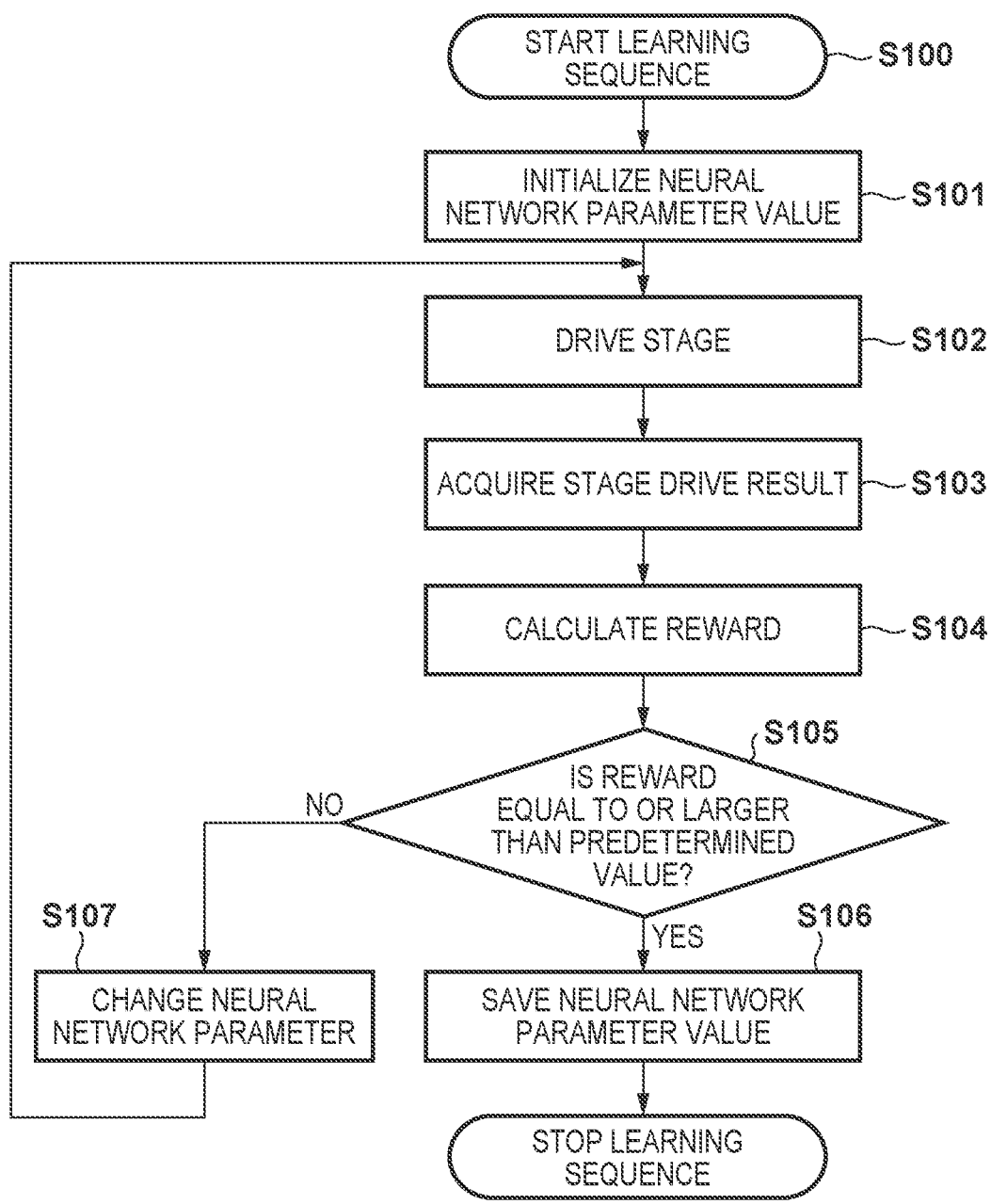
FIG. 4 is a flowchart showing an example of a neural network learning sequence using reinforcement learning according to the first embodiment.

FIG. 4 shows a neural network learning sequence S100 using reinforcement learning. First, in step S101, the learning server 3 communicates with the control apparatus 1 via the control server 2, and initializes the parameter value of the neural network of the controller 10. Then, in step S102, the learning server 3 sends a predetermined operation command to the control apparatus 1 so as to drive the stage mechanism 5 (the stage ST), via the control server 2. In an example, upon receiving the operation command, the control server 2 can supply a driving command (target value string) to the control apparatus 1 so as to drive the stage ST of the stage mechanism 5 along a driving orbit corresponding to the operation command. The control apparatus 1 can be so configured as to accumulate the driving results of the stage mechanism 5, for example, the differences (control deviations) calculated by the calculator 9, and provide the driving results to the control server 2 or the learning server 3 in accordance with a request from the control server 2 or the learning server 3.

In step S103, the learning server 3 acquires the driving results accumulated by the operation in step S102 from the control apparatus 1 via the control server 2. In step S104, the learning server 3 calculates a reward based on the driving results acquired in step S103. An equation for calculating the reward can be so determined that, for example, a high reward is obtained when the control deviation is small. In step S105, the learning server 3 determines whether the reward calculated in step S104 satisfies a learning termination condition. If the reward satisfies the learning termination condition, the learning server 3 advances the process to step S106; if not, the learning server 3 advances the process to step S107. In step S107, the learning server 3 changes the parameter value of the neural network of the controller 10, and executes steps S102 to S105 again after that. In step S106, the learning server 3 saves the latest parameter value of the neural network as a learning result.

Figure 5:
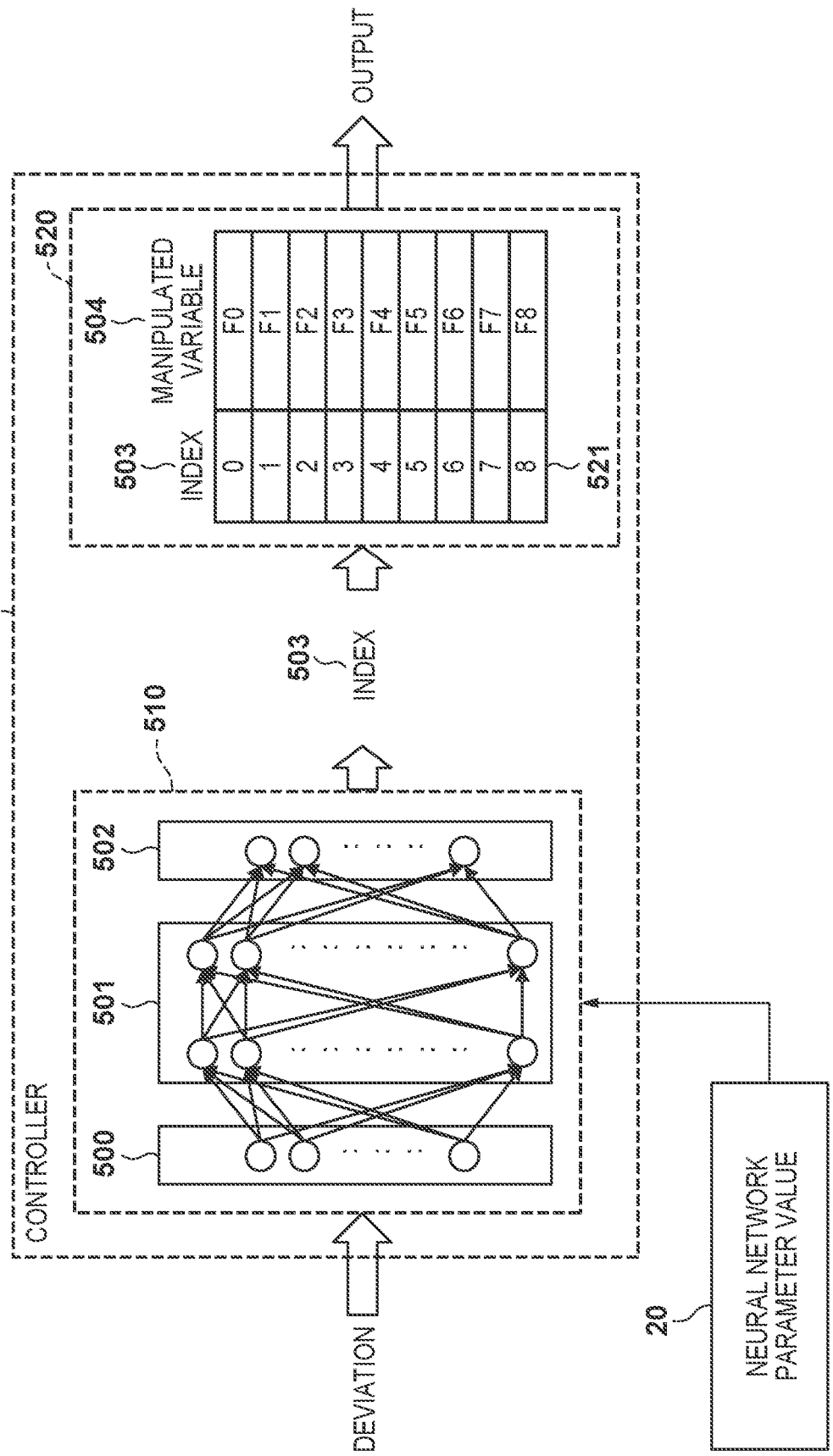
FIG. 5 is a view showing an example of a configuration for determining a manipulated variable to a driver by inputting a control deviation to a controller.

FIG. 5 shows an example of a configuration for determining the manipulated variable for the driver 7 by inputting the control deviation to the controller 10. The controller 10 can include a compensator 510 for outputting an index 503 corresponding to the control deviation (the difference between the output from the measuring device 6 and the target value), and a converter 520 for converting the index 503 into a manipulated variable 504 in accordance with a conversion rule 521. The conversion rule 521 can be given by, for example, a conversion table for defining a plurality of manipulated variables 504 respectively corresponding to a plurality of indices 503. The compensator 510 is formed by a neural network, and the neural network can include an input layer 500, a hidden layer 501, and an output layer 502. The output layer 502 can be formed by a plurality of neurons respectively corresponding to the plurality of indices 503 that can be taken by the input with respect to the conversion rule 521. The operation of the neural network forming the compensator 510 is defined by a preset parameter value, and the neural network calculates the activity of each neuron in the hidden layer 501 and the output layer 502 based on a control deviation input to the input layer 500. Then, the neural network forming the compensator 510 selects the index 503 corresponding to the most active neuron of the plurality of neurons in the output layer 502, and outputs the index 503 as the calculation result of the neural network. The most active neuron of the plurality of neurons is a neuron whose activity has the largest numerical value. The converter 520 outputs the manipulated variable 504 corresponding to the input index 503 in accordance with the conversion rule 521. In other words, the converter 520 converts the input index 503 into the manipulated variable 504 in accordance with the conversion rule 521, and outputs the manipulated variable 504.

One feature of this embodiment is the conversion rule 521. To deeply understand the conversion rule 521 of this embodiment, a comparative example and a problem of the comparative example will be explained first.

Figure 6:
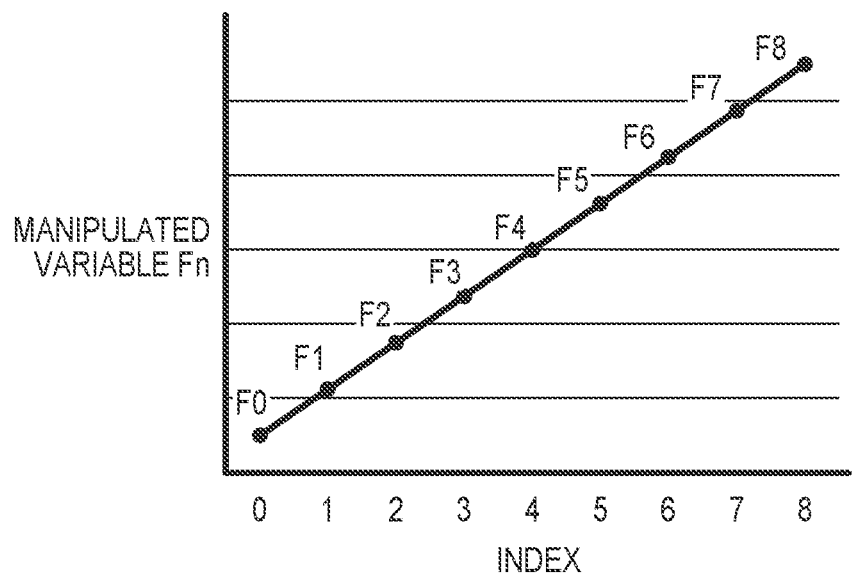
FIG. 6 is a graph showing a conversion rule in a comparative example.

FIG. 6 shows a conversion rule in the comparative example. Referring to FIG. 6, the abscissa indicates the index, and the ordinate indicates the conversion rule as a manipulated variable Fn. In this comparative example, the conversion rule is so defined that when a minimum value of the manipulated variable Fn is F0, a maximum value of the manipulated variable Fn is FN, and the index is n, the index n and the manipulated variable Fn have a linear relationship as indicated by equation (1) below:

$$Fn = n \times (FN - F0)/N + F0 \quad (n = 0 \text{ to } N) \tag{1}$$

Learning was performed in a state in which the conversion rule as described above was set. As the configuration of the control board 8, each of the number of neurons in the output layer 502, the number of indices 503, and the number of manipulated variables 504 was set at 9, and F0 was determined such that F4=0. Under this condition, learning was performed so that the control deviation decreased when the driving command (target value) for the control apparatus 1 had a predetermined value.

Figure 7:
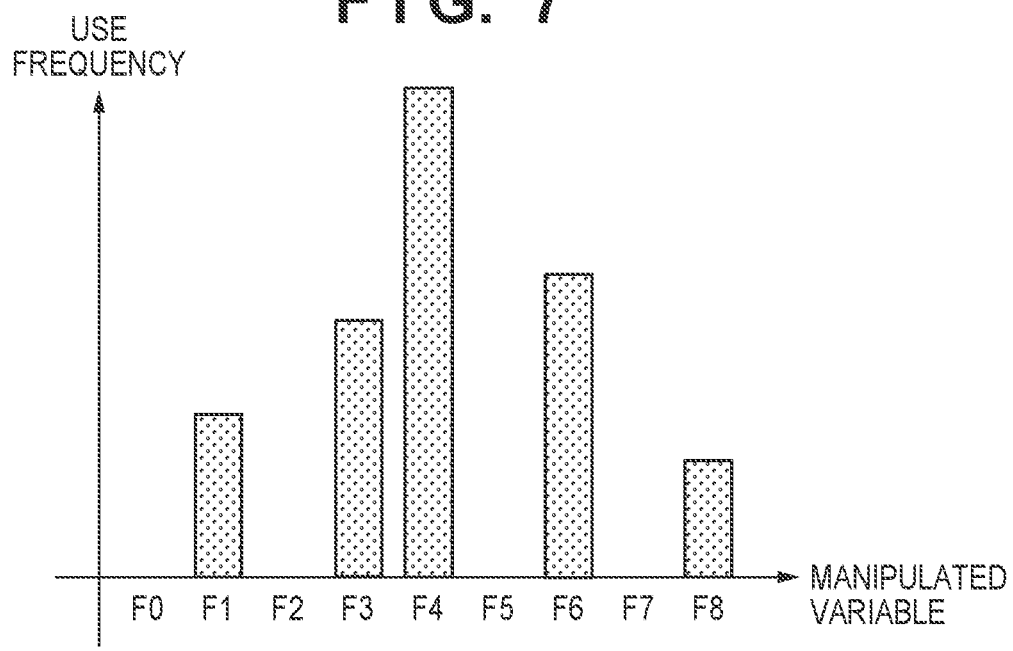
FIG. 7 is a graph showing the frequency of use of each manipulated variable when a maximum reward is obtained by learning in the comparative example.

FIG. 7 shows the frequency of use of each manipulated variable when a maximum reward was obtained by learning in the comparative example. This result shows that manipulated variables F0, F2, F5, and F7 were not used at all. That is, it was determined as a result of the learning that these manipulated variables are unnecessary. The configuration shown in FIG. 3 has the restriction that the controller 10 must generate an output (that is, a manipulated variable) at a predetermined period, so the calculation amount of the controller 10 desirably has no waste. In the comparative example, however, unnecessary manipulated variables exist among the calculated manipulated variables, so it is necessary to delete these manipulated variables or replace them with other manipulated variables.

The conversion rule 521 of the converter 520 according to this embodiment will be explained below in comparison with the abovementioned comparative example. In this embodiment, the conversion rule 521 is set such that the probability distribution of the manipulated variables output from the converter 520 or the controller 10 follows a target probability distribution. The manipulated variable probability distribution is the distribution of probability at which each value of the manipulated variable can appear within the range of the minimum and maximum values of the manipulated variable. When learning is started by defining or setting the conversion rule 521 as described above, waste calculations by the controller 10 can be omitted by reducing the generation of unnecessary manipulated variables. This is advantageous in improving the control characteristics of the control apparatus 1.

The manipulated variable must be so output as to decrease the control deviation of the stage ST. Therefore, when the manipulated variable is plotted on the abscissa and the probability is plotted on the ordinate, the conversion rule 521 preferably has a shape (probability distribution) projecting upward in the entire area between the minimum and maximum values of the manipulated variable. Also, this shape preferably has a peak in a position where the manipulated variable is 0 when an offset value is 0, and a peak in a position where the manipulated variable is an offset value when the offset value is not 0. Note that the offset value can be used to cancel an individual difference caused by a tolerance or the like. The shape that projects upward can be, for example, a normal distribution.

Figure 8:
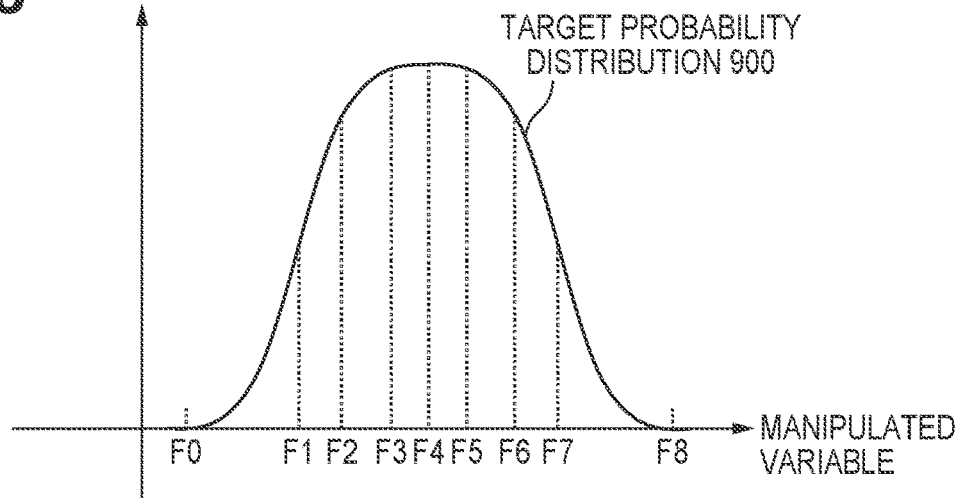
FIG. 8 is a graph showing an example for determining a plurality of manipulated variables based on a target probability distribution in an embodiment.
Figure 9:
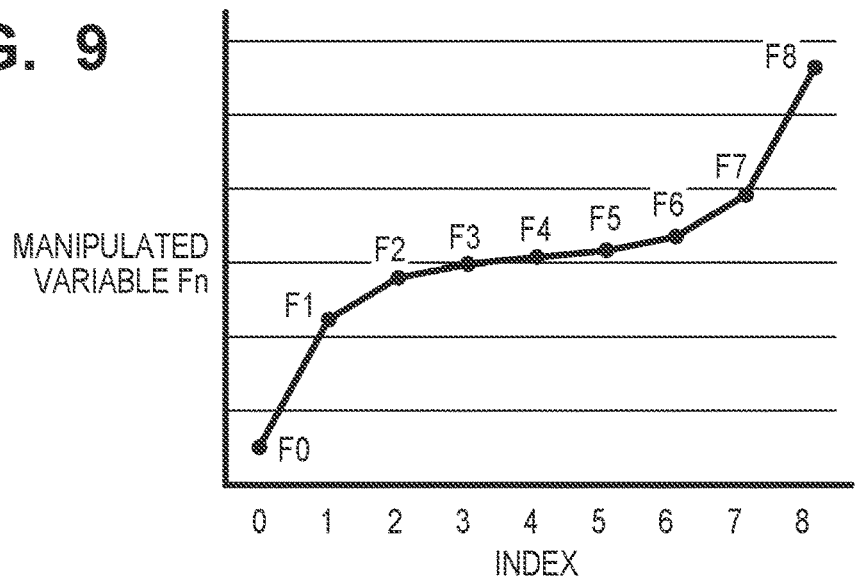
FIG. 9 is a graph showing an example of a conversion rule in the embodiment.

In an example, as shown in FIG. 8, a plurality of manipulated variables F0 to F8 can be determined based on a target probability distribution 900 so that the frequencies of use (probabilities) (an area in FIG. 8) of the plurality of manipulated variables F0 to F8 are constant. FIG. 9 shows the relationship (that is, the conversion rule) between the index and the manipulated variable, which corresponds to the target probability distribution 900 and the plurality of manipulated variables F0 to F8 shown in FIG. 8. The maximum value F8 and the minimum value F0 of the manipulated variable can be determined based on, for example, the weight and the maximum driving acceleration of the stage ST as a controlled object, and the magnification of an assumed maximum control deviation. In addition, when the target probability distribution 900 having the shape projecting upward is a normal distribution, its variance value is related to the resolution of the manipulated variable and hence can be determined in accordance with an assumed maximum control deviation.

Figure 10:
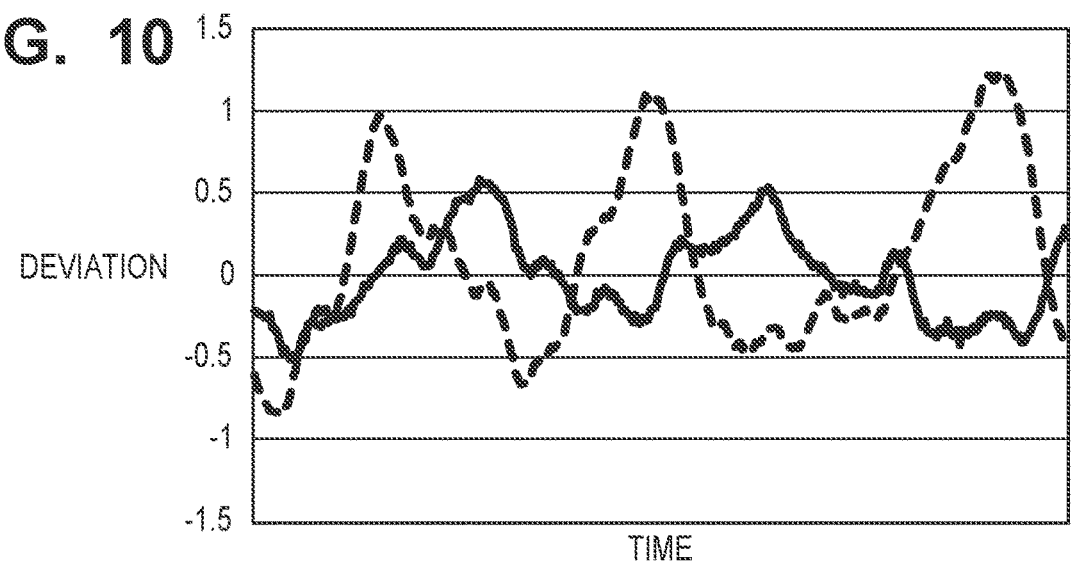
FIG. 10 is a graph showing examples of control deviations in the comparative example and the embodiment.

FIG. 10 shows a control deviation in a state in which a parameter value with which a maximum reward is obtained is set in a neural network, in relation to the comparative example (a dotted line) and this embodiment (a solid line). When compared to the comparative example, a manipulated variable close to zero (F4) can be used in this embodiment, so the output resolution to the driver 7 improves, and as a consequence the control deviation is suppressed more. This means that the control characteristics of this embodiment are superior to those of the comparative example. Also, the time required for learning of this embodiment is shorter than that of the comparative example. In addition, the number of neurons in the neural network forming the compensator 510 of this embodiment is the same as that of the comparative example, so the calculation amount of the controller 10 of this embodiment is also the same as that of the comparative example. However, the position accuracy of the stage ST of this embodiment is higher than that of the comparative example. Furthermore, the effects of this embodiment can be obtained even when the compensator 510 is not formed by a neural network.

Figure 11:
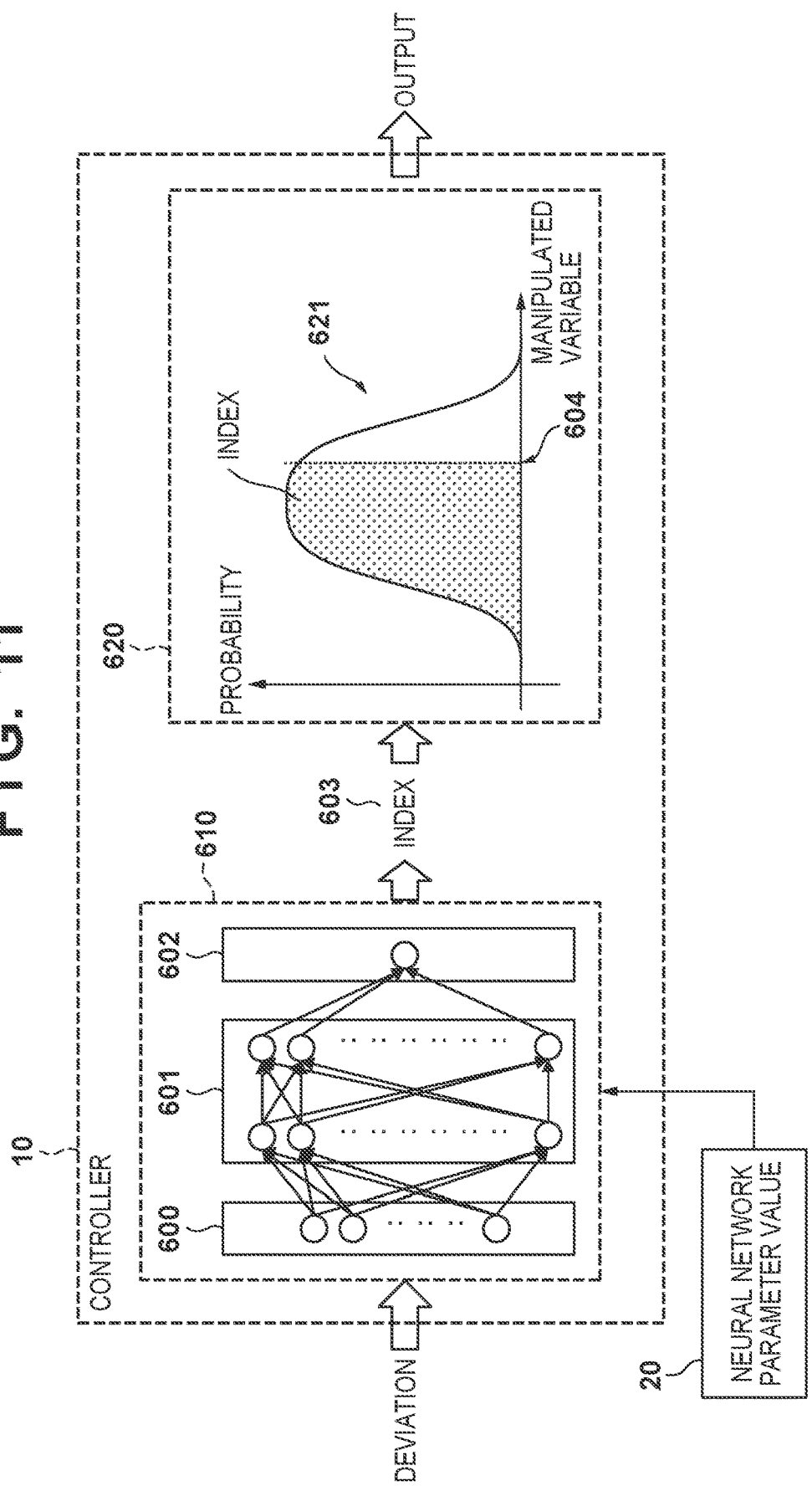
FIG. 11 is a view showing another example of the configuration for determining a manipulated variable to a driver by inputting a control deviation to a controller.

FIG. 11 shows another example of the configuration for determining the manipulated variable to the driver 7 by inputting a control deviation to the controller 10. The controller 10 can include a compensator 610 for outputting an index 603 corresponding to a control deviation (the difference between the output value of the measuring device 6 and a target vale), and a converter 620 for converting the index 603 into a manipulated variable in accordance with a conversion rule 621. The compensator 610 is formed by a neural network, and the neural network can include an input layer 600, a hidden layer 601, and an output layer 602. The output layer 602 is formed by a single neuron. The operation of the neural network forming the compensator 610 is defined by a preset parameter value. The neural network calculates the activity of each neuron in the hidden layer 601 and the output layer 602 based on a control deviation input to the input layer 600. Then, the neural network forming the compensator 610 outputs the index 603 in which the numerical values of the neuron activity in the output layer 602 are normalized to numerical values from 0 to 1, as the calculation result of the neural network. The conversion rule 621 of the converter 620 gives a manipulated variable 604 when an area (integrated value) from F0 matches the index 603, in a target probability distribution (for example, a normal distribution) having a shape projecting upward. In other words, the conversion rule 621 is so set that the probability distribution of the manipulated variable 604 follows the target probability distribution. The converter 620 calculates the manipulated variable 604 in accordance with the conversion rule 621 like this, and outputs the manipulated variable 604 as an output to the controller 10. When the target probability distribution defining the conversion rule 621 is a normal distribution, the average value and the variance value of this normal distribution are arbitrary values.

When a plurality of driving profiles are prepared to control driving of the stage mechanism 5 or the stage ST, it is possible to install the controller 10 for each driving profile, and select the controller 10 corresponding to the driving profile from the plurality of controllers 10. In this case, the conversion rules of the converters 520 and 620 can be determined for each controller 10.

In the controller 10 having a relationship (conversion rule) between the index and the manipulated variable determined based on a given target probability distribution, in order to achieve a higher positioning accuracy after a series of learning sequences are performed, the learning sequences can be performed again by changing the target probability distribution. For example, in the controller 10 having an index-manipulated variable relationship determined based on a given target probability distribution, in order to achieve a higher positioning accuracy after a series of learning sequences are performed, the learning sequences can be performed again by changing the target probability distribution. This change of the target probability distribution can include, for example, a change of at least one of the average value and the variance value.

A case in which a plurality of stage control apparatuses as shown in FIG. 3 are adjusted will be explained below. In this case, after a parameter value 20 of a neural network is obtained by performing the learning sequence S100 in a first stage control apparatus, the learned parameter value 20 can be applied to a second stage control apparatus. Consequently, the second stage control apparatus can achieve a positioning accuracy equivalent to that of the first stage control apparatus without performing any learning. It is also possible to perform the learning sequence S100 by applying the learning parameter value 20 as an initial value to the second stage control apparatus. In this case, the learning can also be performed by changing the spread amount and the shift amount in the manipulated variable direction of the target probability distribution that provides the conversion rule of the controller 10 of the second stage control apparatus.

Figure 12:
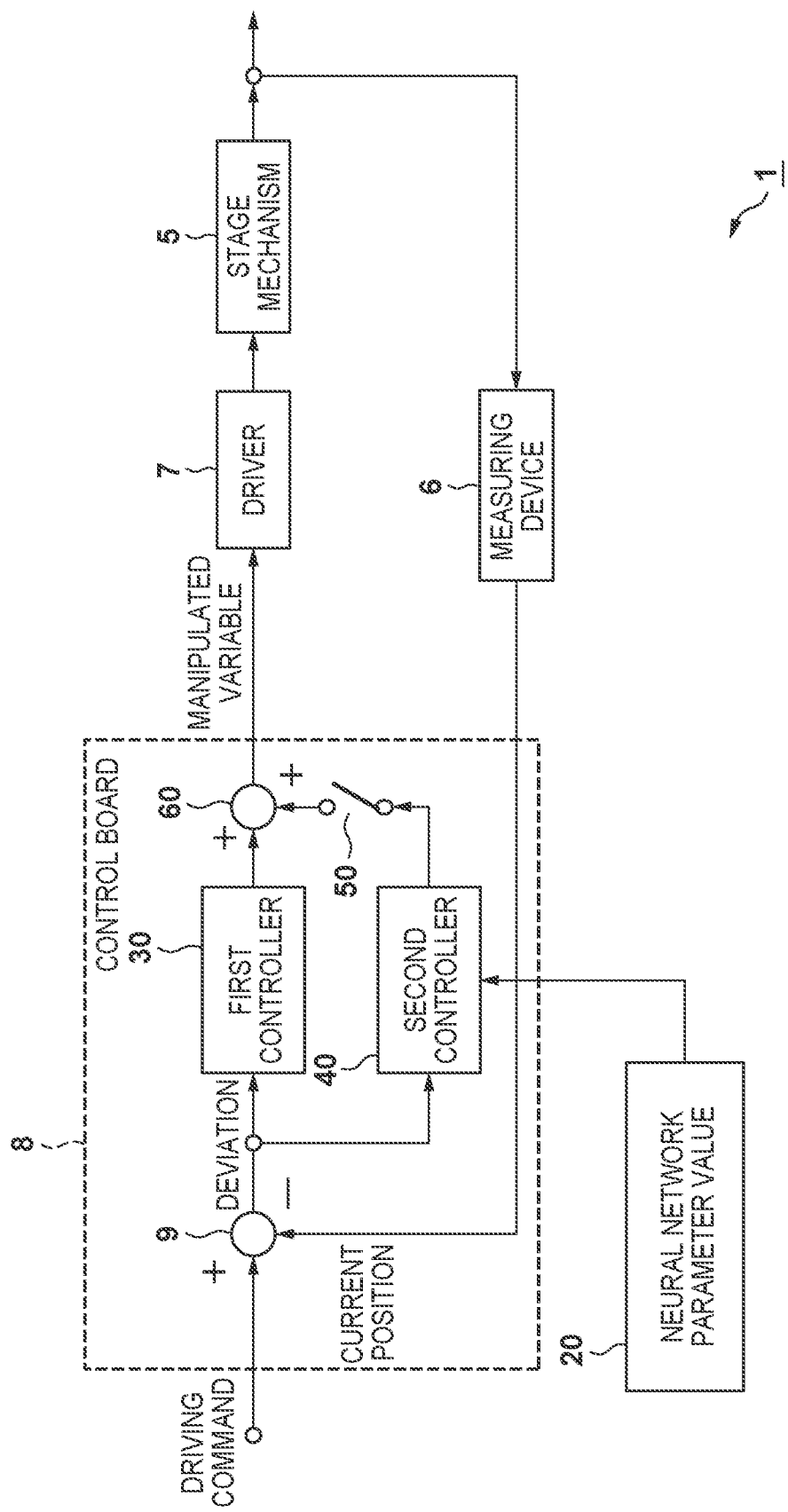
FIG. 12 is a view showing an example in which a control apparatus in a system of the second embodiment is applied to a positioning apparatus.

The second embodiment will be explained below. Items not mentioned in the second embodiment follow those of the first embodiment. FIG. 12 shows the configuration of a control apparatus 1 of the second embodiment. The control apparatus 1 of the second embodiment is configured as a positioning apparatus in this example, but the control apparatus 1 can also be configured as a control apparatus of another form. A control board 8 can include a calculator 9 for calculating a difference (control deviation) between the state (for example, the position) of a controlled object measured by a measuring device 6 and a driving command (target value) for controlling the controlled object, and first and second controllers 30 and 40 for generating first and second manipulated variables corresponding to the output of the calculator 9. The controllers 30 and 40 can also be understood as constituent elements for generating manipulated variables based on the state of a controlled object and a driving command. The first controller 30 can be, for example, a PID controller. The second controller 40 operates as a compensator defined by a parameter value of a neural network provided from a learning server 3. Like the controller 10 of the first embodiment, the second controller 40 includes a compensator 510 (610) and a converter 520 (620). The control board 8 can also include a calculator (adder) 60 for generating a manipulated variable for manipulating a controlled object based on the first and second manipulated variables, and a switch 50 for opening/closing a path connecting the second controller 40 and the calculator 60. A driver 7 can convert the manipulated variable provided by the control board 8 or the controller 10 into an electric current.

Figure 13:
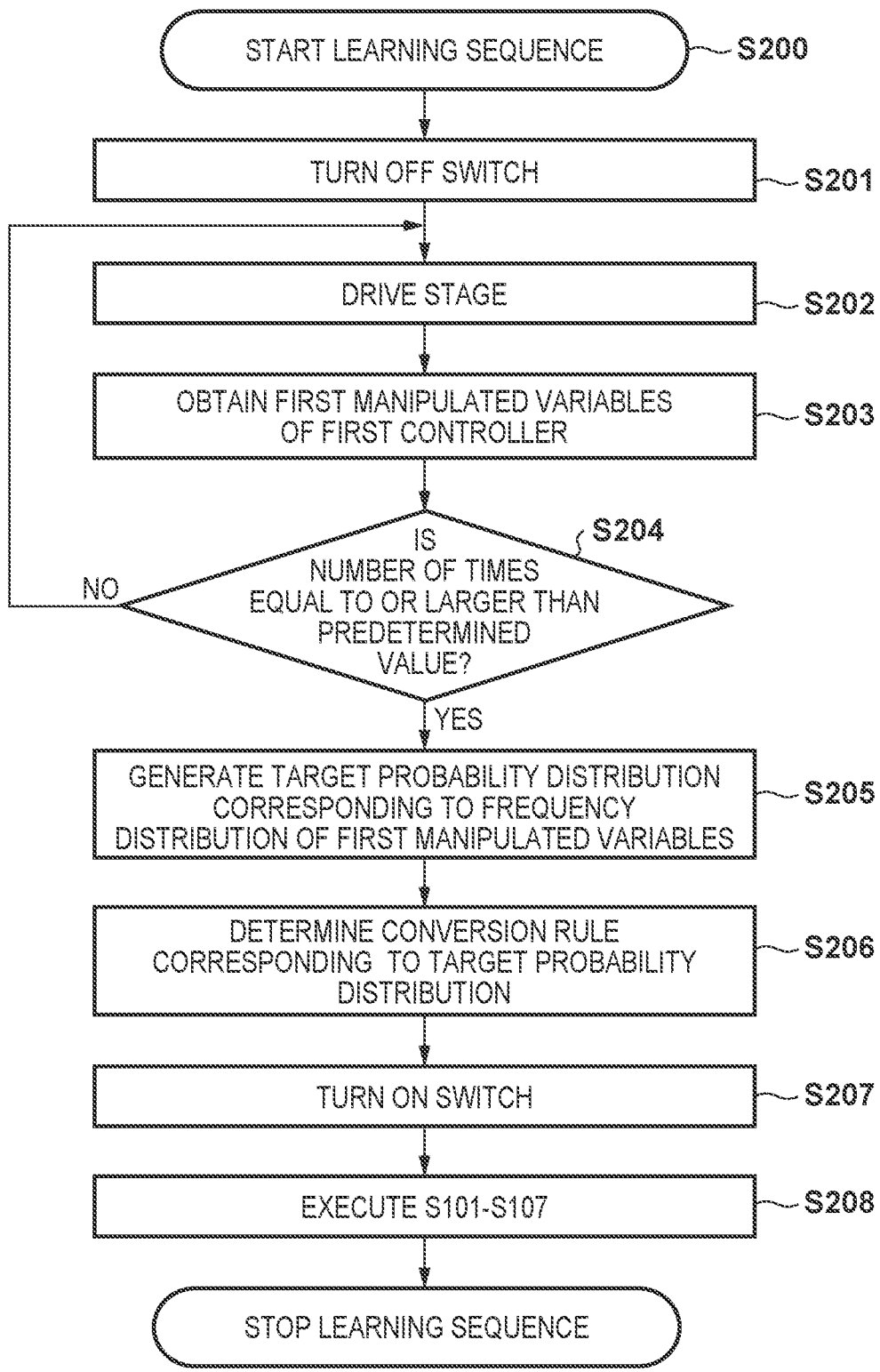
FIG. 13 is a flowchart showing an example of a neural network learning sequence using reinforcement learning according to the second embodiment.

FIG. 13 shows an example of a learning sequence 200 of the control apparatus 1 of the second embodiment. FIG. 13 shows a neural network learning sequence using reinforcement learning corresponding to the configuration shown in FIG. 12. First, in step S201, the learning server 3 turns off the switch 50. Consequently, the control board 8 or the control apparatus 1 is set in a mode by which the calculator 60 generates a manipulated variable based on not the second manipulated variable but the first manipulated variable. Then, in step S202, the learning server 3 sends a predetermined operation command to the control apparatus 1 so as to operate a stage mechanism 5, via a control server 2. In this example, upon receiving the operation command, the control server 2 can supply a driving command (target value string) to the control apparatus 1 so as to drive a stage ST along a driving orbit corresponding to the operation command. The control apparatus 1 can be so configured as to accumulate manipulated variables generated by the control board 8 (the first controller 30), and provide the driving result to the control server 2 or the learning server 3 in accordance with a request from the control server 2 or the learning server 3. In step S203, the learning server 3 obtains the manipulated variables accumulated by the operation in step S202 from the control apparatus 1 via the control server 2. In step S204, the learning server 3 determines whether the number of times of execution of steps S202 and S203 is equal to or larger than a predetermined value. If the number of times of execution is equal to or larger than the predetermined value, the learning server 3 advances the process to step S205; if not, the learning server 3 executes steps S202 and S203 again.

In step S205, the learning server 3 generates a manipulated variable frequency distribution based on the manipulated variables obtained over a predetermined number of times, and determines a target probability distribution corresponding to the frequency distribution. This target probability distribution corresponding to the frequency distribution can be a probability distribution having a shape identical or similar to that of the frequency distribution, or a probability distribution having the same feature as a feature extracted from the frequency distribution. However, the target probability distribution can also have another correlation with respect to the frequency distribution.

In step S206, the learning server 3 generates a conversion rule corresponding to the target probability distribution determined in step S205, and sets this conversion rule in the converter of the second controller 40. This process is the same as that of the first embodiment. In step S207, the learning server 3 turns on the switch 50. As a consequence, the control board 8 or the control apparatus 1 is set in a mode by which the calculator 60 generates a manipulated variable to be supplied to the driver 7, based on the first and second manipulated variables. Then, in step S208, the learning server 3 performs steps S101 to S107 shown in FIG. 4. Note that the neural network parameter value is set in the neural network of the second controller 40.

In the second embodiment, the conversion rule to be set in the converter of the second controller 40 is a conversion rule corresponding to the probability distribution of the first manipulated variable when a controlled object is controlled in the mode by which the calculator 60 generates a manipulated variable based on not the second manipulated variable but the first manipulated variable. The learning server 3 functions as a setting device for setting the conversion rule like this in the converter of the second controller 40. The setting device like this can also be incorporated into the control apparatus 1.

Figure 14:
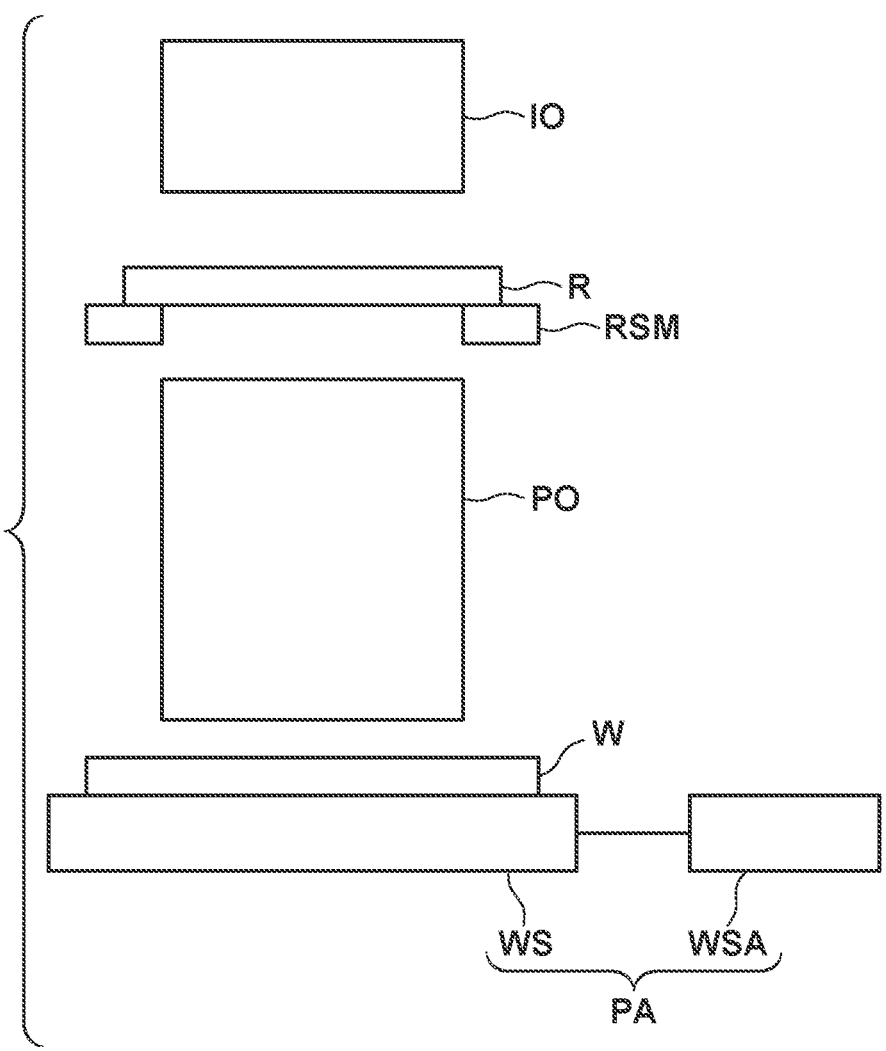
FIG. 14 is a view showing a configuration example of an exposure apparatus as a lithography apparatus.

The abovementioned positioning apparatus can be incorporated into a lithography apparatus for transferring an original pattern onto a substrate, and the stage ST of this positioning apparatus can be so configured as to hold and position the substrate. FIG. 14 shows an example of the configuration of an exposure apparatus EXP as an example of the lithography apparatus incorporating the abovementioned stage mechanism. The exposure apparatus EXP can include a projection optical system PO for projecting a pattern of an original R onto a substrate W. The exposure apparatus EXP can also include a substrate positioning apparatus PA for positioning the substrate W, an original positioning apparatus RSM for positioning the original R, and an illumination optical system IO for illuminating the original R. The abovementioned positioning apparatus is applicable to the substrate positioning apparatus PA. The substrate positioning mechanism PA can include a stage WS as a movable part for holding the substrate W, and an actuator WSA for driving the stage WS. Alternatively, the abovementioned positioning apparatus is applicable to the original positioning apparatus RSM.

Figure 15:
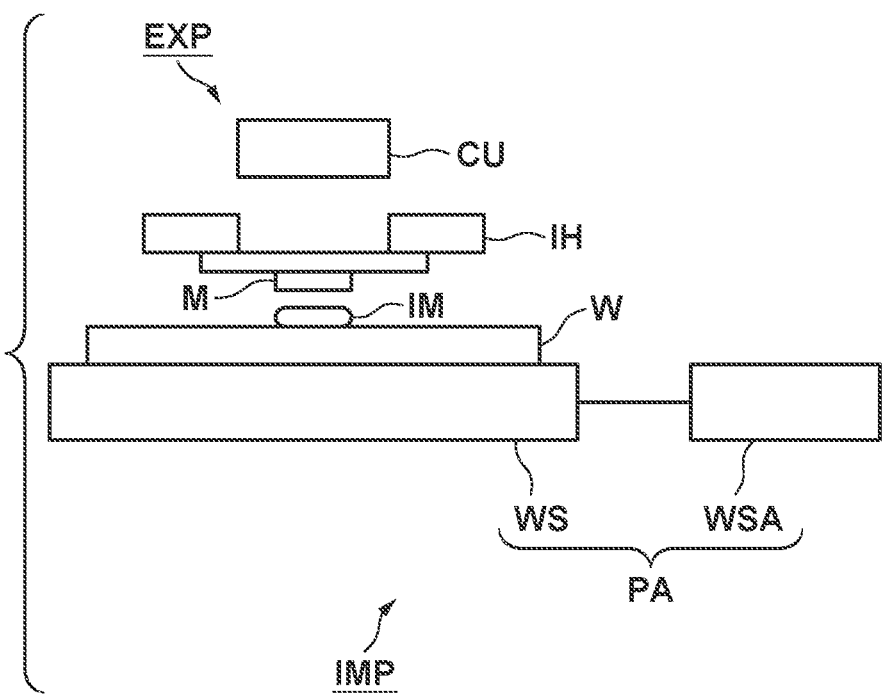
FIG. 15 is a view showing a configuration example of an imprint apparatus as a lithography apparatus.

FIG. 15 shows an example of the configuration of an imprint apparatus IMP as an example of the lithography apparatus incorporating the abovementioned stage mechanism. The imprint apparatus IMP transfers a pattern of an original M onto an imprint material IM on the substrate W. The imprint apparatus IMP can include the substrate positioning apparatus PA for positioning the substrate W, an imprint head IH for driving the original M, and a curing unit CU for curing the imprint material. The imprint head IH can bring a pattern region of the original M into contact with the imprint material IM on the substrate W, and can separate the original M from the cured imprint material IM. The curing unit CU can irradiate the imprint material IM with curing energy (for example, light energy) in a state in which the pattern region of the original M is in contact with the imprint material IM on the substrate W, thereby curing the imprint material IM. The abovementioned positioning apparatus can be applied to the substrate positioning apparatus PA.

The abovementioned lithography apparatus is applicable to an article manufacturing method of manufacturing an article. This article manufacturing method can include a pattern formation step of forming a pattern on a substrate by using the abovementioned lithography apparatus, and a processing step of obtaining an article by processing the substrate on which the pattern is formed. The processing step can include a step of etching the substrate by using the pattern as an etching mask. The processing step can include a step of forming a film on the substrate, a step of sealing the substrate, and the like. The article manufacturing method can also perform a pattern formation method a plurality of times.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-027746, filed Feb. 24, 2021, which is hereby incorporated by reference herein in its entirety.

What is claimed is:

1. A control apparatus for controlling a controlled object, the control apparatus comprising:
   a measuring device configured to measure a state of the controlled object; and
   a controller configured to generate a manipulated variable corresponding to an output of the measuring device and a target value,
   wherein the controller includes:
      a compensator, including a neural network, configured to output an index corresponding to the output of the measuring device and the target value; and
      a converter configured to convert the index into the manipulated variable such that a probability at which a predetermined manipulated variable is generated is a target probability.

2. The apparatus according to claim 1, wherein a distribution of the target probability has a shape projecting upward in an entire area between a minimum value and a maximum value of the manipulated variable when the manipulated variable is plotted on an abscissa and the probability is plotted on an ordinate.

3. The apparatus according to claim 1, wherein a distribution of the target probability is a normal distribution when the manipulated variable is plotted on an abscissa and the probability is plotted on an ordinate.

4. The apparatus according to claim 1, wherein the compensator determines the index in accordance with a difference between the output of the measuring device and the target value.

5. A control apparatus for controlling a controlled object, the control apparatus comprising:
   a measuring device configured to measure a state of the controlled object; and
   a controller configured to generate a manipulated variable corresponding to an output of the measuring device and a target value,
   wherein the controller includes:
      a compensator configured to output an index corresponding to the output of the measuring device and the target value; and
      a converter configured to convert the index into the manipulated variable such that a probability at which a predetermined manipulated variable is generated is a target probability, wherein the compensator includes a neural network including an input layer, a hidden layer, and an output layer, and wherein a parameter value of the neural network is determined by performing learning in a state in which a conversion rule for converting the index into the manipulated variable is set.

6. The apparatus according to claim 5, wherein:

the converter includes a conversion table for defining a plurality of manipulated variables respectively corresponding to a plurality of indices, the output layer of the neural network is formed by a plurality of neurons respectively corresponding to the plurality of indices, and the index to be output from the compensator corresponds to a most active neuron of the plurality of neurons.

7. The apparatus according to claim 5, wherein the output layer is formed by a single neuron, and the neural network determines the index in accordance with an activity of the neuron in the output layer.

8. The apparatus according to claim 7, wherein the index to be output from the compensator is obtained by normalizing the activity of the neuron in the output layer.

9. A control apparatus for controlling a controlled object, the control apparatus comprising:

a measuring device configured to measure a state of the controlled object;

a first controller configured to generate a first manipulated variable corresponding to an output of the measuring device and a target value;

a second controller configured to generate a second manipulated variable corresponding to the output and the target value; and a calculator configured to generate a manipulated variable for manipulating the controlled object based on the first manipulated variable and the second manipulated variable, wherein the second controller includes:
    a compensator configured to output an index corresponding to the output and the target value; and
    a converter configured to convert the index into the second manipulated variable in accordance with a conversion rule, and wherein the conversion rule is a conversion rule corresponding to a probability distribution of the first manipulated variable when the controlled object is controlled in a mode by which the calculator generates the manipulated variable based on not the second manipulated variable but the first manipulated variable.

10. A control apparatus for controlling a controlled object, the control apparatus comprising:

a measuring device configured to measure a state of the controlled object;

a first controller configured to generate a first manipulated variable corresponding to an output of the measuring device and a target value;

a second controller configured to generate a second manipulated variable corresponding to the output and the target value;

a calculator configured to generate a manipulated variable for manipulating the controlled object based on the first manipulated variable and the second manipulated variable; and a setting device, wherein the second controller includes:
    a compensator configured to output an index corresponding to the output and the target value; and
    a converter configured to convert the index into the second manipulated variable in accordance with a conversion rule, and wherein the setting device sets the conversion rule in accordance with a probability distribution of the first manipulated variable when the controlled object is controlled in a mode by which the calculator generates the manipulated variable based on not the second manipulated variable but the first manipulated variable.

11. A positioning apparatus comprising:

a stage mechanism including a stage;

a driver configured to drive the stage mechanism;

a measuring device configured to measure a state of the stage; and the control apparatus defined in claim 5, wherein the control apparatus is configured to control the stage as the controlled object.

12. A positioning apparatus comprising:

a stage mechanism including a stage;

a driver configured to drive the stage mechanism;

a measuring device configured to measure a state of the stage; and the control apparatus defined in claim 9, wherein the control apparatus is configured to control the stage as the controlled object.

13. A positioning apparatus comprising:

a stage mechanism including a stage;

a driver configured to drive the stage mechanism;

a measuring device configured to measure a state of the stage; and the control apparatus defined in claim 10, wherein the control apparatus is configured to control the stage as the controlled object.

14. A lithography apparatus for transferring a pattern of an original onto a substrate, the lithography apparatus comprising:

the positioning apparatus defined in claim 11, wherein the stage of the positioning apparatus holds the substrate.

15. A lithography apparatus for transferring a pattern of an original onto a substrate, the lithography apparatus comprising:

the positioning apparatus defined in claim 12, wherein the stage of the positioning apparatus holds the substrate.

16. A lithography apparatus for transferring a pattern of an original onto a substrate, the lithography apparatus comprising:

the positioning apparatus defined in claim 13, wherein the stage of the positioning apparatus holds the substrate.

17. The lithography apparatus according to claim 14, wherein the lithography apparatus is configured as:

an exposure apparatus by further including a projection optical system configured to project a pattern of the original onto the substrate, or an imprint apparatus for transferring a pattern of the original onto an imprint material on the substrate.

18. An article manufacturing method comprising:

forming a pattern on a substrate using the lithography apparatus defined in claim 14; and obtaining an article by processing the substrate on which the pattern is formed.

19. An article manufacturing method comprising:

forming a pattern on a substrate using the lithography apparatus defined in claim 15; and obtaining an article by processing the substrate on which the pattern is formed.

20. An article manufacturing method comprising:
forming a pattern on a substrate using the lithography apparatus defined in claim 16; and
obtaining an article by processing the substrate on which the pattern is formed.

* * * * *